United States Patent [19]

Wang et al.

[11] Patent Number: 4,996,186

[45] Date of Patent: Feb. 26, 1991

[54] FLUX METHOD FOR PRODUCING CRYSTALS OF SUPERCONDUCTING YBA$_2$CU$_3$O$_7$

[75] Inventors: Zhao Z. Wang, Princeton; Nai-Phuan Ong, Belle Mead, both of N.J.

[73] Assignee: Princeton University, Princeton, N.J.

[21] Appl. No.: 228,979

[22] Filed: Aug. 5, 1988

[51] Int. Cl.$^5$ .................. H01L 39/12; C30B 9/06; C01F 17/00
[52] U.S. Cl. ........................ 505/1; 156/621; 252/521; 420/901; 505/729
[58] Field of Search ............. 156/621; 252/521; 505/1, 729; 420/901

[56] References Cited

U.S. PATENT DOCUMENTS 4,824,826 4/1989 Damento et al. .................. 505/1

OTHER PUBLICATIONS

Taylor et al., Jour. Crystal Growth, 88 (1988) 541.
Hermann et al., Appl. Phys. Letts., 51 (Nov. 1987) 1854.
Takei et al., Jap. Jour. Appl. Phys. 26 (Sep. 1987) L-1425.
Campa et al., Jour. Crystal Growth 91 (1988) 334.
Hayashi et al., Jap. Jour. Appl. Phys. 27 (Sep. 1988) L-1646.
Journal of Crystal Growth 85(4) 563-677 (1987).
Dinger et al., Phys. Rev. Lett. 58, 2687 (1987).
Worthington et al., Phys. Rev. Lett. 59, 1160 (1987).
Kaiser et al., Appl. Phys. Lett. 51, 1040 (1987).
Schneemeyer et al., Nature 328, 601 (1987).
Hikata et al., Phys. Rev. B36, 7199 (1987).
Kaiser et al., Journal of Crystal Growth 85, 593, (1987).

Primary Examiner—Upendra Roy
Attorney, Agent, or Firm—Mathews, Woodbridge & Collins

[57] ABSTRACT

Method for producing single crystals of YBa$_2$Cu$_3$O$_7$ which undergo a transition to the superconducting state above 90K, comprising:

(a) preparing a flux composition by mixing BaO$_2$ and CuO powders in the molecular weight ratio of approximately 1:1, layering on top of the mixture powdered YBa$_2$Cu$_3$O$_7$ in an amount up to approximately 20% of the total weight of the BaO$_2$—CuO mixture, firing the mixture in air at approximately 930° C.-950° C. for approximately 24 hours, and thereafter raising the temperature from 930° C.-950° C. to approximately 1025°-1030° C. within ½ hour and maintaining the temperature at approximately 1025° C.-1030° C. for approximately one hour to one and one-half hours;

(b) cooling thereafter the flux to approximately 1020° C.-980°;

(c) providing an oxygen gas flow to the flux when the temperature is approximately 1020° C.-980° C.;

(d) maintaining the flux in an oxygen gas flow at approximately 980° C. for approximately 30 minutes or longer;

(e) cooling thereafter the flux in oxygen gas flow from approximately 980° C. to 960° C. at a rate of no more than 2° to 20° C./hour; and (f) cooling thereafter the flux slowly to room temperature in an oxygen gas flow.

8 Claims, No Drawings

FLUX METHOD FOR PRODUCING CRYSTALS OF SUPERCONDUCTING YBA$_2$CU$_3$O$_7$

FIELD OF THE INVENTION

This invention relates to a flux method to grow single crystals of the 90K superconductor YBa$_2$Cu$_3$O$_7$.

BACKGROUND OF THE INVENTION

Since the discovery by Chu and coworkers of the compound YBa$_2$Cu$_3$O$_7$ and the demonstration that it undergoes a transition to the superconducting state above 90K, many groups around the world have tried to develop methods to grow single crystals of YBa$_2$Cu$_3$O$_7$. Progress in the commercial development of superconducting electronic devices utilizing the superconductor YBa$_2$Cu$_3$O$_7$ (also referred to in the literature as "123") requires the availability of high-quality single crystals.

Previous reports which have appeared in the scientific literature disclose attempts to grow single crystals of YBa$_2$Cu$_3$O$_7$ which produced non-superconducting or weakly superconducting crystals as-grown, with a superconducting transition temperature (T$_c$) below 70K. Transition widths of these crystals as-grown are very broad (10-20K). For a compendium, see the special issue on high-Tc superconductors: Journal of Crystal Growth 85, (4) 563-677 (1987). Also, see Dinger et al., Phys. Rev. Lett. 58, 2687 (1987); Worthington et al., Phys. Rev. Lett. 59, 1160 (1987); Kaiser et al., Appl. Phys. Lett. 51, 1040 (1987); Schneemeyer et. al., Nature 328, 601 (1987); Hikata et al., Phys. Rev. B 36, 7199 (1987).

The previously reported attempts to grow single crystals of superconducting YBa$_2$Cu$_3$O$_7$ entail a flux mixture of BaO, CuO and Y$_2$O$_3$. The as-grown crystals obtained by these reported processes were not superconducting above 90K. The poor superconducting properties of these crystals as-grown reflect a serious oxygen deficiency in the crystals incurred by the wrong growth conditions. A subsequent very long oxygen annealing was required to bring the oxygen content of the crystals up to the desired 7/formula unit. (See Kaiser et al., Jnl. Crystal Growth 85, 593, 1987.) Kaiser et al. disclosed that their as-grown crystals have a broad transition with -a mid-point at 60K. Only after oxygen annealing these as-grown crystals for ten days at 420° C. was the transition temperature improved to 92K and the transition became sharp. Similar results have been reported by Schneemeyer et al., Nature, 328, 601 (1987). Other authors report that the crystals as-grown according to their methods are tetragonal, that is, the oxygen content is less than 6.5 per formula unit. (See Jnl. Crystal Growth 85 (4), 1987)

BRIEF SUMMARY OF THE INVENTION

In contrast to the previous reports, applicants disclose herein a novel flux technique which produces high-quality single crystals of YBa$_2$Cu$_3$O$_7$ which are superconducting above 90K as-grown. All crystals as-grown according to the methods disclosed herein have a uniformly high T$_c$ exceeding 90K. The transition widths of most crystals are under 0.5K. In contrast to the methods reported to date in the scientific literature, applicants' methods to produce superconducting crystals of YBa$_2$Cu$_3$O$_7$ do not require an oxygen treatment of these crystals in a separate annealing run.

Applicants' novel process is based upon the discovery that in order to produce single crystals of YBa$_2$Cu$_3$O$_7$ which are superconducting as-grown, it is essential that the flux have the correct oxidation state of BaCuO$_{2+x}$, both in the solid and liquid states. Applicants have determined that a change in 2+x of a few percent is sufficient to affect adversely the oxygen content of the subsequently as-grown crystals of YBa$_2$Cu$_3$O$_7$. The oxygen content determines the T$_c$ of the crystal. Under applicants' flux conditions disclosed herein, all crystals as-grown do not require a separate oxygen annealing and have a uniformly high T$_c$ exceeding 90K.

Applicants' novel process for growing single crystals of the superconductor YBa$_2$Cu$_3$O$_7$, which are superconducting above 90K as-grown, comprises:

(a) preparing a flux composition by mixing BaO$_2$ and CuO powders in the molecular weight ratio of approximately 1:1, layering on top of the powdered mixture YBa$_2$Cu$_3$O$_7$ in an amount up to approximately 20% of the total weight of the BaO$_2$-CuO mixture, firing the mixture in air at approximately 930° C -950° C for approximately 15 hours or longer to thereby form BaCuO$_{2+x}$ where x=0.10 to 0.20, and thereafter raising the temperature from 930° C.-950° C. to 980° C.-1040° C. within ½ hour to melt the BaCuO$_{2+x}$ to form a flux;

(b) maintaining the temperature of the flux mixture of step (a) at 980° C.-1040° C. for an amount of time sufficient to dissolve the YBa$_2$Cu$_3$O$_7$ into the molten BaCuO$_{2+x}$;

(c) cooling thereafter the flux mixture to approximately 1020° C.-980° C.;

(d) providing an oxygen gas flow to the flux when the temperature is approximately 1020° C.-980° C.;

(e) maintaining the flux in an oxygen gas flow at approximately 980° C. for approximately 30 minutes or longer; and (f) cooling thereafter the flux slowly to room temperature in continuing oxygen gas flow.

According to the methods disclosed further herein, presynthesized YBa$_2$Cu$_3$O$_7$ in sintered form was synthesized as described in the literature by heating stoichiometric mixtures of the starting compounds Y$_2$O$_3$, BaCO$_3$, CuO. After one firing, the sintered YBa$_2$Cu$_3$O$_7$ starting material was obtained.

The pre-synthesized YBa$_2$Cu$_3$O$_7$ powder which had been layered on top of a BaO$_2$-CuO flux prepared as described below was solvated in the flux mixture by heating to a temperature between 980° C.-1040° C. (preferably 1025°-1030° C.) and held there for an approximate ½ hour to 3 hours (preferably 1 hour to 1.5 hours) soak period. After the soak period, the flux was cooled to approximately 1020° C.-980° C. in approximately 2 to 10 minutes and an oxygen flow was turned on when the flux mixture was approximately 1020° C.-980° C. The flux was further cooled in an oxygen gas flow according to a tailored temperature versus time profile to room temperature. As the temperature fell below the crystallization point, the YBa$_2$Cu$_3$O$_7$ crystals co-crystallized with a large amount of BaCuO$_{2+x}$ and a smaller amount of CuO crystals.

Crystals of YBa$_2$Cu$_3$O$_7$ were formed inside cavities in the solidified flux. After withdrawal from the furnace, the crucibles were inverted and tapped at the bottom. By breaking the cap of the cavity and tapping the inverted crucible, large single crystals were removed with little damage. By carefully dislodging some of the hardened flux material, it was possible to free a large fraction of the remaining crystals with minimal damage. No solvents were necessary to dissolve the flux.

A common crystallization pattern was the occurrence of a thin crust of hardened flux which capped a large cavity within which were found a large collection of $YBa_2Cu_3O_7$ crystals lightly attached to more numerous crystals of $BaCuO_{2+x}$. Although the two compounds are blue-black in reflected light, they are easily distinguished by the very distinct crystal habits. $BaCuO_{2+x}$ has a characteristic "emerald cut" habit whereas $YBa_2Cu_3O_7$ is invariably in the form of a rectangular prism with sharp edges 90° corners. $YBa_2Cu_3O_7$ also showed diffraction fringe patterns which are at 45° to the crystal edge when viewed in reflected white light.

The advantages of applicants' process are as follows:

1. Crystal Structure

Using the methods reported to date in the scientific literature, the as-grown crystals are oxygen deficient, and therefore are not superconducting as-grown. A long oxygen annealing is required to bring the oxygen up to the required 7/formula unit. However, even with a very long oxygen annealing, the oxygen is able to penetrate only the surfaces of the crystal and cannot penetrate into the core. Therefore, applicants' crystals produced according to the processes disclosed here and which contain the required 7 oxygens/formula unit as-grown are superior in structure to those as-grown and oxygen-annealed crystals disclosed in the scientific literature to date.

2. Reproducibility.

All crystals removed from the crucible were found to be superconducting with a transition temperature $T_c$ above 90K asgrown. A further oxygen anneal was not required. Transition width was very narrow (0.1 to 0.5K as-grown), indicating the homogeneity of the superconducting properties. The crystals averaged $1.0 \times 1.0 \times 0.05$ mm$^3$ in size. At the high end, crystals up to $3 \times 3 \times 0.1$ mm$^3$ have been found.

3. Low Lattice Disorder.

Electrical measurements on all crystals studied showed that the resistivity at room temperature was approximately 5 to 10 times smaller than reported by other groups on single crystals, and 10 to 30 times smaller than commonly found in ceramic samples. A low degree of lattice disorder in the as-grown crystals of the present process is indicated by the low value of the resistivity of electrical conductivity.

4. Ease of Separation from Flux.

Because $YBa_2Cu_3O_7$ is sensitive to water, difficulties would be encountered during separation of flux-grown crystals from the solidified flux when using aqueous solvents. The advantage of the present process is that the flux does not wet the crystal. When solidified, the flux separates from the $YBa_2Cu_3O_7$ crystals so that the latter are easily separated by gentle mechanical pressure.

5. Relatively High Rate of Growth.

The as-grown crystals of the present process are orthorhombic. Crystal growth rates were estimated to be 30 to 100 Angstroms/second along the c axis. The growth rates in the a and b directions are about 10 times higher. Centimeter sized crystals which are superconducting as-grown may be grown in a period of a few weeks.

DETAILED DESCRIPTION OF THE INVENTION

The following is a detailed procedure for carrying out the process of the present invention.

1. Preparation of $YBa_2Cu_3O_7$ powder.

A mixture (of total weight 50 g) of $Y_2O_3$, $BaCO_3$, CuO in the ratio (molecular weight) 1:4:6 was fired at 1030° C. for 2 hours, followed by firing at 980° C. for 24 hours. The temperature was gradually reduced from 980° to 900° C. at a rate of 40° C./hour, and from 900° to 750° C. at a rate of 80° C./hour. Finally, it was cooled to 200° C. at a rate of 100° to 150° C./hour. Both the firing and cooling were performed in an oxygen gas flow. For methods of preparing $YBa_2Cu_3O_7$ starting material, see *Novel Superconductivity*, edited by S. A. Wolf and V. Z. Kresin (Plenum, 1987), p. 581, 653. Also, J. M. Tarascon et al., Phys. Rev. B. 35, 7115 (1987).

The solid state reaction occurs as follows:

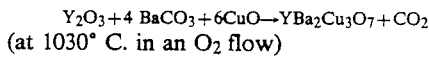
$Y_2O_3 + 4\ BaCO_3 + 6CuO \rightarrow YBa_2Cu_3O_7 + CO_2$
(at 1030° C. in an $O_2$ flow)

The resulting solid consisted of a partially melted sinter containing thousands of shiny crystallites (average size under 50 um). The crystallites occurred both on the surface of the solidified mass as well as deep in the interior. Occasionally the undesirable "green phase" was observed at the bottom of the sinter. This, however, did not affect the subsequent crystal growth.

To determine the composition of the sinter, an electron beam micro-probe in an energy dispersive spectrometer (JEOL 840 scanning electron microscope with a Princeton Gamma Tech EDS analyzer) was used. The sinter was found to be mostly the $YBa_2Cu_3O_7$ compound with small contaminations of BaCuO and $Y_2BaCuO_5$ near the bottom. In preparation for the next step, the sinter was thoroughly ground to a fine powder.

2. Preparation of the $BaO_2$/CuO flux composition

Barium peroxide ($BaO_2$) and copper oxide (CuO) powders were mixed in the molecular weight ratio of approximately 1:1, with a total weight of 12.5 g, and placed preferably in a fused (20 ml, 35 mm × 35 mm) quartz crucible. The use of an alumina crucible did not yield optimal results. An amount of the pre-synthesized $YBa_2Cu_3O_7$ powder equal to 1.5-2.0 g (10-20% of the total weight of the $BaO_2$ - CuO powders) was placed on top of the $BaO_2$CuO mixture. The crucible was then placed in the furnace inside a horizontal alumina tube which was capped lightly at both ends. The crucible was fired in air at 930° C. to 950° C. for approximately 15-50 hours, preferably 24 hours. The firing caused the $BaO_2$ and CuO to react and form $BaCuO_{2+x}$ (with the oxygen in an oxidation state slightly higher than 2). The amount of oxygen available to the contents of the crucible at this stage was very crucial, since the actual oxidation state of $BaCuO_2$ was determined by the amount of oxygen available. Firing in air (as was done here) resulted in the optimal oxidation state of $BaCuO_{2+x}$ where x=0.10–0.20, optimally 0.15. On the other hand, firing in an oxygen flow converted the mixture to an x value of 0.25, which is undesirable due to the high melting temperature of $BaCuO_{2.25}$.

3. Solvation of $YBa_2Cu_3O_7$ powder in Flux

Next the temperature was raised from 930° C.-950° C. to approximately 1025° to 1030° C. within ½ hour, and held there for a sufficient amount of time to melt the $BaCuO_{2+x}$ and to dissolve the $YBa_2Cu_3O_7$, approximately ½ hour to 3 hours, optimally 1 hour to 1.5 hours. A temperature of 1025° to 1030° C. is optimal, but a temperature ranging from approximately 980° C. to 1040° C. may be used. However, if $T_{max}$ exceeds 1040° C., excessive conversion of $YBa_2Cu_3O_7$ to the compound $Y_2BaCuO_5$ occurs. If $T_{max}$ is too low (under 980° C.), no subsequent crystal growth is obtained. Further, subsequent optimal crystal growth was obtained when the top of the crucible was about 2° to 5° C. cooler than the bottom. This vertical thermal gradient was maintained by separate heater controls in a two-zone furnace.

The interface between liquid and solid $BaCuO_{2+x}$ gradually moved upwards as the flux melted. The $YBa_2Cu_3O_7$ powder sank into the molten flux. After 20 minutes the contents of the crucible became uniformly distributed and no trace of the $YBa_2Cu_3O_7$ powder was visible. Usually the temperature was maintained at 980° C.–1040° C. for approximately 1–2 hours to ensure that the $YBa_2Cu_3O_7$ was fully dissolved.

4. $YBa_2Cu_3O_7$ crystal growth

At the end of the solvation period, the crucible was cooled down to approximately 1020° C.–980° C. in approximately 2–10 minutes. An oxygen gas flow (approximately 5 liters per minute) was commenced when the mixture had cooled to approximately 1020°–980° C. In order to obtain single crystals of $YBa_2Cu_3O_7$ which are superconducting above 90K as-grown, the oxygen gas flow should commence after the temperature reaches approximately 1020°–980° C. If it is turned on too early, before the temperature cools to approximately 1020° C.–980° C., the flux composition is adversely affected, thereby adversely affecting the superconductivity of the as-grown crystals.

After commencing the oxygen gas flow, the temperature was held at 980° C. for a period of time, usually approximately 30 minutes or more. The mixture was then cooled slowly to room temperature in an oxygen gas flow. All crystals thus obtained were high-quality single crystals which were superconducting above 90K as-grown. To obtain large superconducting crystals as-grown, the flux was optimally cooled to room temperature in an oxygen gas flow according to a tailored temperature versus time profile: the crucible was cooled from approximately 980° to 960° C. at a rate of no more than 2° to 20° C./hour; from 960° to 880° C. at a rate of no more than 10° to 50° C./hour and from 880° to 400° C. at a rate of no more than 20° to 100° C./hour. The furnace power was shut off at 400° C., and the crucible cooled at a rate determined by the thermal capacity of the furnace.

The cooling rate when the temperature was between approximately 980° C. and 960° C. was determined to be the most important for the eventual size of the crystals. By lowering the rate in this window from 20° C./hour to 10° C./hour, the thickness of the crystals along the c axis was increased from 100 um to 250 um. To obtain good sized crystals, cooling from approximately 980° C. to 960° C. is optimally no faster than 2° to 20° C./hour. However, the entire cooling process may be slowed to days or weeks to obtain large crystals or to change the growth habit.

A useful indicator of optimum crystal growth was the weight loss of the crucible during the firing. With the starting weights specified above, applicants found that the optimum weight loss equalled approximately 0.82 to 0.84 gm for an initial flux weight of 12.5 g. This corresponds to a flux composition (after the crucible is cooled to room temperature) of $BaCu_yO_2$ where $y=1.05$, assuming all the weight loss is from the loss of oxygen.

5. Extraction of crystals

The top of the solidified contents in the crucible was covered by a shiny cap which had the appearance of shiny metallic triangular wedges. The cap was easily perforated by a sharp pair of tweezers and disintegrated to reveal a large cavity in which were found scores of highly reflective crystals of $YBa_2Cu_3O_7$ mixed with $BaCuO_2$ and CuO. The sides of the cavity were completely lined with crystals of the three types so that the amorphous flux was excluded from the volume of the cavity. By sharply tapping the inverted crucible (after removing the flux cap) it was possible to dislodge many of the crystals. The remaining were removed by driving the tweezer into cavity sides and partially lifting the crystal bed. (Some damaged crystals are sacrificed in the process.)

The $YBa_2Cu_3O_7$ crystals were visually distinguished from the $BaCuO_2$ and CuO crystals. Crystals of $YBa_2Cu_3O_7$ grow as rectangular prisms with very sharp edges and corners. They are black with a deep blue tinge. (Evidence of bevelled edges indicates $BaCuO_2$ crystals.) If the corners are not 90° in all directions then the crystal is not $YBa_2Cu_3O_7$. The crystals produced by applicants' process are also strongly orthorhombic, that is, $(b-a)/a = 2.7\%$, so that twin defects can be observed. By tilting the crystal face in reflected white light the twin defects appear as weak interference fringes which assume parallel lines. The appearance of these characteristic fringe patterns is a fail-safe indicator of the orthorhombic $YBa_2Cu_3O_7$ phase. Neither $BaCuO_2$ nor CuO crystals display the fringe patterns. Both are black without the blue tinge of $YBa_2Cu_3O_7$. $BaCuO_2$ crystals usually grow in the form of cuboids with roughly equal dimension (0.5 to 1 mm) in the three directions. Extensive hopper growth is observed in $BaCuO_2$ crystals. The edges are distinctly bevelled. CuO crystals are needle shaped with ends that are pyramidal.

Numerous experiments were performed on the $YBa_2Cu_3O_7$ crystals as-grown according to the method outlined above in order to confirm the composition, crystal structure and superconductivity. Rutherford Back Scattering experiments with alpha particles confirmed the ratio of Y:Ba:Cu to be 1.00: 1.98: 2.95. Energy Dispersive Spectroscopy (EDS) microprobe also confirmed the composition. Back-reflected Laue x-ray diffraction showed that the crystals are orthorhombic with extensive twinning defects. Transmission electron microscopy (TEM) confirmed that the orthorhombic parameter $(b-a)/a$ equals 2.7% within an untwinned domain. The twin defects and extent of untwinned domains was studied using Normaski differential interference contrast microscopy with reflected white light. Striking multicolored pictures of the twinning patterns have been obtained. The superconducting transition was determined to be between 90 and 93K for all crystals tested by high precision resistivity measurements. The width of the transitions as measured by the temperature derivative of the resistivity was as narrow as 0.2K in most crystals. Magnetic susceptibility measurements also showed a sharp superconducting transition with Tc above 90K in single crystals. The magnetic shielding fraction $f_s$ was measured by warming the sample in a field H of 100 Gauss (after it is cooled in zero field). $f_s$ was found to be 95% with the field normal to the c axis. The Meissner fraction $f_m$ was measured while the sample was cooled below Tc in a field (normal to C) of 100 G. $f_m$ was found to be approximately 15% when H=100 G. Positron annihilation measurements indicate the crystal has a uniform oxygen content and transition temperature is above 90K. Finally, thermopower measurements (of the Seebeck coefficient) with the thermal gradient directed along the c axis and perpendicular to it were performed. The thermopower in both directions vanishes at $T_c$ consistent with superconductivity.

What is claimed is:

1. A method for producing single crystals of $YBa_2Cu_3O_7$ which undergo a transition to the superconducting state above 90K, comprising:
   (a) preparing a flux composition by mixing $BaO_2$ and CuO powders in the molecular weight ratio of approximately 1:1, layering on top of the mixture powdered $YBa_2Cu_3O_7$ in an amount up to approximately 20% of the total weight of the $BaO_2$-CuO mixture, firing the mixture in air at approximately 930° C.-950° C. for approximately 15 hours or longer to thereby form $BaCuO_{2+x}$ where x=0.10 to 0.20, and thereafter raising the temperature from 930° C.-950° C. to 980° C.-1040° C. within ½ hour to melt the $BaCuO_{2+x}$ to form a flux;
   (b) maintaining the temperature of the flux of step (a) at 980° C.-1040° C. for an amount of time sufficient to dissolve the $YBa_2Cu_3O_7$ into the molten $BaCuO_{2+x}$;
   (c) cooling thereafter the flux to approximately 1020° C.-980° C.;
   (d) providing an oxygen gas flow to the flux when the temperature is approximately 1020° C.-980° C.;
   (e) maintaining the flux in an oxygen gas flow at approximately 980° C. for approximately at least 30 minutes; and
   (f) cooling thereafter the flux slowly to room temperature in continuing oxygen gas flow.

2. The method of claim 1 wherein the firing in step (a) is carried out in air at approximately 930° C.-950° C. for approximately 24 hours.

3. The method of claim 1 wherein the solvating step (b) is carried out at a temperature of approximately 1025° C.-1030° C. for approximately ½ to 3 hours.

4. The method of claim 1 wherein during the cooling step (f), the temperature is cooled from approximately 980° C. to 960° C. at a rate of no more than 2° C. to 20° C./hour.

5. The method of claim 1 wherein during step (e) a vertical temperature gradient is provided such that the top of the flux is approximately 2° to 5° C. cooler than at least a portion of said flux below said top.

6. The method of claim 5, wherein the temperature is further cooled from 960° C. to 880° C. at a rate of no more than 10° C. to 50° C./hour, and from 880° C. to 400° C. at a rate of no more than 20° C. to 100° C./hour.

7. A method for producing single crystals of $YBa_2Cu_3O_7$ which undergo a transition to the superconducting state above 90K, comprising:
   (a) preparing a flux composition by mixing $BaO_2$ and CuO powders in the molecular weight ratio of approximately 1:1, layering on top of the mixture powdered $YBa_2Cu_3O_7$ in an amount up to approximately 20% of the total weight of the $BaO_2$-CuO mixture, firing the mixture in air at approximately 930° C.-950° C. for approximately 24 hours, and thereafter raising the temperature from 930° C.-950° C. to approximately 1025°-1030° C. within ½ hour and maintaining the temperature at approximately 1025° C.-1050° C. for approximately one hour to one and one-half hours;
   (b) cooling thereafter the flux to approximately 1020° C.-980°;
   (c) providing an oxygen gas flow to the flux when the temperature is approximately 1020° C.-980° C.;
   (d) maintaining the flux in an oxygen gas flow at approximately 980° C. for approximately at least 30 minutes;
   (e) cooling thereafter the flux in oxygen gas flow from approximately 980° C. to 960° C. at a rate of no more than 2° to 20° C./hour; and
   (f) cooling thereafter the flux slowly to room temperature in an oxygen gas flow.

8. The method of claim 7 wherein during the cooling step (f) the temperature is cooled from 960° C. to 880° C. at a rate of no more than 10° C. to 50° C./hour, and from 880° C. to 400° C. at a rate of no more than 20° C. to 100° C./hour.

* * * * *